United States Patent [19]
Kazmierski et al.

[11] Patent Number: 5,821,570
[45] Date of Patent: *Oct. 13, 1998

[54] SEMICONDUCTOR STRUCTURE HAVING A VIRTUAL DIFFRACTION GRATING

[75] Inventors: Christophe Kazmierski, Morganis; Didier Robein, Nevilly Plaisance, both of France

[73] Assignee: France Telecom Etablissement Autonome De Droit Public, Paris, France

[*] Notice: This patent issued on a continued prosecution application filed under 37 CFR 1.53(d), and is subject to the twenty year patent term provisions of 35 U.S.C. 154(a)(2).

[21] Appl. No.: 374,313

[22] Filed: Jan. 18, 1995

[30] Foreign Application Priority Data

Jan. 20, 1994 [FR] France ................................ 94 00587

[51] Int. Cl.$^6$ .................................................. H01L 33/00
[52] U.S. Cl. .......................... 257/97; 257/101; 257/103; 372/45; 372/96; 372/102
[58] Field of Search .................................. 257/184, 185, 257/96, 97, 101, 103; 372/96, 102, 45

[56] References Cited

U.S. PATENT DOCUMENTS

| | | |
|---|---|---|
| 3,814,498 | 6/1974 | Tomlinson, III et al. . |
| 4,445,218 | 4/1984 | Coldren . |
| 4,885,753 | 12/1989 | Oaki et al. . |
| 4,932,032 | 6/1990 | Koch et al. . |
| 5,020,072 | 5/1991 | Abe et al. ................................. 372/96 |
| 5,295,150 | 3/1994 | Vangieson et al. ....................... 372/96 |
| 5,319,666 | 6/1994 | Ackerman ................................ 372/96 |
| 5,363,399 | 11/1994 | Yagi . |

FOREIGN PATENT DOCUMENTS

| | | |
|---|---|---|
| 2684498 | 11/1992 | France . |
| 58-196088 | 2/1984 | Japan . |
| 59-031088 | 2/1984 | Japan . |
| 59-226320 | 12/1984 | Japan . |
| 60-247986 | 12/1985 | Japan . |
| 61-014787 | 1/1986 | Japan . |
| 61-191093 | 8/1986 | Japan . |
| 63-073585 | 8/1988 | Japan . |
| 1124279 | 5/1989 | Japan . |
| 01124279 | 8/1989 | Japan . |
| 2106706 | 4/1983 | United Kingdom . |

OTHER PUBLICATIONS

Y. Tohmori et al., "Broad range wavelength tunable superstructure garting (SSG) DBR lasers", IEEE Journal of Quantum Electronics, vol. 29, No. 6, Jun. 1993, New York, US, pp. 1817–1823.

Y. Kotaki et al. "Wavelength tunable DFB and DBR lasers for coherent optical fibre comunications", IEEE Proceedings–J; vol. 138, No. 2, Apr. 1991.

(List continued on next page.)

Primary Examiner—Ngân V. Ngô
Attorney, Agent, or Firm—Pearne, Gordon, McCoy & Gibson LLP

[57] ABSTRACT

Semiconductor structure having a virtual diffraction grating.

This structure comprises an intermediate semiconductor layer (4) between two other semiconductor layers (6,8) having opposite dopings and on one side of the intermediate layer a periodic arrangement or layout (12,14) able to spatially modulate the distribution of the charge carriers or the electric field in said intermediate layer when an electric current is injected into the p-n junction formed by the two other layers or said junction is reverse biased. The periodic arrangement is located in one of the first and second semiconductor layers and is constituted by a sequence of first semiconductor zones having a doping below $10^{19}$ cm$^{-3}$ and of the opposite type to that of the semiconductor layer in which the periodic arrangement is located, alternating with second semiconductor zones having the same doping type as that of the semiconductor layer in which the periodic arrangement is located. Application to distributed feedback laser diodes or distributed Bragg reflectors.

9 Claims, 5 Drawing Sheets

OTHER PUBLICATIONS

U.S. application No. 08/382,510, Delorme et al. filed Feb. 2, 1995.

Y. Yoshikuni et al., "Broadly tunable distributed Bragg reflector lasers with a multiple–phase–shift super–structure grating", paper TuC2, p. 8 Proceedings OFC/IooC'93, San Jose, USA., 21–26 Feb. 1993. IEEE Photonics Techn. Lett., vol. 4, No. 4, Apr. 1992.

R. C. Alferness et al., "Broadly tunable InGaAsp/InP laser made based on vertical coupler filter with 57 nm tuning range", Appl. Phys. Letters, vol. 60, No. 26, 29 Jun. 1992.

IEEE Photonics Techn. Lett., vol. 4, No. 4, Apr. 1992, L.A. Wang et al: "Integrated Four–Wavelength DFB Laser Array with 10 Gb/s Speed and 5 nm Continuous Tuning Range". Proceedings OFC/IOOC'93, Paper PD23, p. 95, San Jose, USA, pp. 21–26, Feb. 1993, T. L. Koch et al: "Incoherent Contact–print Grating Technology for WDM Laser Sources".

IEEE Photon. Technol. Lett., vol. 2, No. 8, Aug. 1990, pp. 529–530, M. Oaki et al.: "Corrugation–Pitch–Modulated MQW–DFB Laser with Narrow Spectral Linewidth (170 kHz)".

Proceedings 13th IEEE Int'l. Semicon. Laser Conf., Paper 6, Sep. 21–25, 1992, Takamatsu, Japan, pp. 268–269, Y. Tohmori et al: "Ultrawide Wavelength Tuning with Single Longitudinal Mode By Super Structure Grating (SSG) DBR Lasers".

A. Takemoto et al., "Dependence of characteristics of buried grating type DFB laser diodes on the coupling constant", Technical Digest, 12 IEEE International Semiconductor Laser Conference, Sep. 92, Davos, Switzerland, paper E–3.

W. Streifer et al., "Effect of external reflectors on longitudinal modes of distributed feedback lasers", IEEE J. Quantum Electron., QE–11 (1975), p. 154.

K. Utaka et al., "Analysis of quarter wave shifted DGB lasers", Electron., Lett., 20 (1984), p. 326.

H. Kogelnik et al., "Coupled wave theory of distributed feedback lasers", J. Appl. Phys. 43 (1972), p. 2327.

U.S. applications No. 08/349,567, Delorme filed Dec. 5, 1994.

Y. Nakano et al., Appl. Phys. Lett., 55 (1989), p. 1606; same authors: Extended Anstracts, 1988 International conference on Solid State Devices and Materials, Tokyo, 1988, paper D–4–4.

B. Borchert et al., IEEE Photon. Technol. Lett., 3 (1991), p. 955.

W.T. Tsang et al., IEEE Photon. Technol. Lett., 4 (1992), p. 212.

K. Tada, "Gain coupled DFB lasers", Technical Digest, OFC/IOOC'93, San Diego, paper ThB1 (invited). (This reference was also cited in the French Search Report.)

K. Kudo et al., "Reduction of effective linewidth enhancement factor of DFB laser with complex coupling coefficients", IEEE Photon. Technol. Lett., 4 (1992), p. 531.

Y. Luo et al., "Fabrication and characteristics of gain coupled DFB semiconductor lasers with a corrugated active layer", IEEE J. Quantum Electron., 7(1991), p. 1724.

J. Charil et al., "Extremely low threshold operation of 1.5 $\mu$m GaInAsP/InP buried ridge stripe laser", Electron. Lett. 25 (1989), p. 1477.

C. Kazmierski et al., "Universal iron behaviour in Zn–, Cd–and Be–doped p–type InP", J. of crystal growth 116 (1992), p. 75.

M.T. Camargo Silva et al., "MMIC Based Optical Modulator Design", 1992 IEEE MTT–S International Microwave Symposium Digest, New York, pp. 571–574.

Koch, Thomas L., "Novel Laser Devices", Proceedings of the 13th IEEE International Semiconductor Laser Conference, Sep. 21–25, 1992, Takamatsu, Japan.

SEMICONDUCTOR STRUCTURE HAVING A VIRTUAL DIFFRACTION GRATING

BACKGROUND OF THE INVENTION

The present invention relates to a semiconductor structure comprising:

a first semiconductor layer having a first doping type, an intermediate semiconductor layer placed above the first semiconductor layer and a second semiconductor layer having a second doping type opposite to the first type, said second semiconductor layer being placed above the intermediate semiconductor layer and forming, with the first semiconductor layer, a p-n junction, the forbidden band widths of the first and second semiconductor layers exceeding that of the intermediate semiconductor layer.

It more particularly applies to the field of information transmission in the form of light, which can be guided, e.g. by optical fibres, or non-guided.

The invention e.g. makes it possible to obtain various semiconductor devices having a double heterostructure and in particular laser diodes, light modulators, light filters and light amplifiers.

Laser diodes of this type are known, in which a part able to guide the light is in the form of a stripe and in which an optical feedback takes place, either by reflection of light on mirrors constituted by faces perpendicular to the part guiding the light and which can be cleaved or etched, or by means of diffraction gratings, which are periodic structures inducing a spatial modulation of the optical index or gain in said laser diodes.

As a result of the filtering by optical diffraction caused by them, said diffraction gratings produce a distributed feedback, which leads to a longitudinal monomode operation (operation at a single frequency) of the laser diodes and filters having such diffraction gratings.

These monofrequency filters and lasers have applications wherever a single wavelength has to be emitted or selected, e.g. in optical telecommunications systems using several wavelengths, in lasers for optical pumping and in the field of Lidar metrology. These monofrequency lasers have the advantage of limited spectral dimensions under modulation.

This is used in optical telecommunications systems, in fast microwave information transmission systems and for the generation of coherent optical pulses.

In a distributed feedback laser, more simply referred to as a DFB laser of the conventional type, the feedback is obtained by means of a periodic grating of alternate materials having different optical indexes, said grating being positioned in the light propagation direction and is more simply referred to as an index grating (cf. document (1) which, like the other documents cited in the present application, is referred to at the end of the present description).

This type of DFB laser has a serious disadvantage. In this laser, the side mode suppression ratio or SMSR is very sensitive to the respective positions of the reflecting cleaved faces and of the index grating, said positions being intrinsically random at the submicron scale (cf. document (2)). Moreover, on eliminating the reflectivity of these faces by an appropriate anti-reflection treatment, the laser becomes bimode.

In order to obviate this disadvantage, one of the most frequently used solutions consists of producing at least two diffraction gratings, which are spatially phase shifted in the same laser (cf. document (3)). This permits a monofrequency operation of the laser, but does not make it possible to reduce the sensitivity to the position of the reflecting faces.

However, a theoretical solution to the problem caused by this DFB laser with an index grating has existed for more than twenty years, as can be gathered from document (4). Thus, as is stated in document (4) the bimode operation of a DFB laser with an index grating can become perfectly monomode if the optical index modulation is replaced by a modulation of the laser gain (reference then being made to a DFB laser with a pure gain grating).

However, the first practical demonstration of this theoretical forecast only took place in 1988 (cf. document (5)), due to technological problems linked with the production of a pure gain grating.

Despite the increasing interest in DFB lasers with a pure gain grating, the technological solutions for producing such lasers are still limited and frequently lack flexibility.

At present two solutions are known for obtaining gain grating DFB lasers (the term "coupling by gain" is used in connection with such lasers).

The first solution, resulting directly from the technology of index gratings, consists of replacing the material having the optical index different from that of the material surrounding it by a material able to absorb the optical wave (cf. documents (5), (6) and (7)).

This leads to a combined absorption spatial modulation and a confinement factor modulation which, to a certain extent, bring about the overall gain modulation function, in view of the fact that the gain is greater than the absorption.

One of the disadvantages of this first solution is that it increases the optical losses in the light-guiding structure, which leads to an increase in the threshold current in the case of laser diodes. This optical loss rise can be limited on using a n-type semiconductor material for producing the absorbing grating (cf. document (8)).

Another disadvantage of this first solution is linked with the nature of the absorbing material, whose forbidden band must have a width close to that of the material of the active layer. In this case there is both an absorption and a pronounced optical index jump, which leads to a complex coupling (i.e. a device having both an index grating and a pure gain grating) with a pronounced predominance of the coupling by optical index.

Therefore this first solution has a lack of flexibility if it is wished to adjust, independently of one another, the amplitude of the gain relative to the amplitude of the optical index and the spatial phase shift of the gain relative to the optical index. It is also very difficult and even impossible to obtain a coupling by the pure gain with this first solution.

The second known solution consists of obtaining an amplifier grating by direct etching of the active layer of the laser (cf. documents (9) and (10)).

With such a configuration and without supplementary optical losses, it is possible to obtain the modulation of the gain, the modulation of the confinement factor and a pronounced optical index modulation. Thus, apart from the losses, the same disadvantages as with the first solution occur.

However, it would appear that it is possible to obtain a pure gain grating, although it is very difficult to bring about from the technological standpoint, by the compensation of the index modulation, which is due to the etching of the active layer, as a result of positive and negative index jumps of the confinement layers (cf. document (10)).

It is therefore possible to envisage controlling the component relative to the gain in the complex coupling with respect to the component relative to the optical index.

However, the major disadvantage of all these known amplifier grating components is the need to directly etch the active layer of said components, which leads to crystal defects when growing layers adjacent to the active layer and which can also be incompatible with the reliability requirement for the components.

SUMMARY OF THE INVENTION

The present invention relates to a semiconductor structure having a virtual diffraction grating, i.e. a semiconductor structure in which it is possible to obtain an amplitude-modulatable grating, when a diffraction grating is required.

The present invention uses a periodic layout or arrangement permitting the formation, in the structure, of a system of charge carriers or a modulated electric field when said structure is appropriately controlled (by current injection or reverse bias). Thus, a diffraction grating is obtained, whose pitch spacing is equal to the period of the arrangement having said structure.

A structure according to the invention can incorporate a virtual pure gain grating (coupling by gain) or a virtual optical index grating (coupling by index) or a mixed virtual grating, namely a virtual index and pure gain (complex coupling) grating.

The present invention solves the problem of obtaining in simple manner a coupling by pure gain, in an optoelectronic device having an active layer, without it being necessary to etch the layer, and following the production thereof.

The invention also provides technological flexibility for the production of complex coupling gratings, i.e. structures having both an index grating and a pure gain grating (gratings which can be spatially in phase or in phase opposition).

More specifically, the present invention relates to a semiconductor structure comprising:

a first semiconductor layer having a first doping type, an intermediate semiconductor layer placed above the first semiconductor layer and a second semiconductor layer having a second doping type which is the opposite to the first type, said second semiconductor layer being placed above the intermediate semiconductor layer and forming, with the first semiconductor layer, a p-n junction, the forbidden band width of the first and second semiconductor layers being greater than that of the intermediate semiconductor layer, said structure being characterized in that it also comprises on one side of the intermediate semiconductor layer, a periodic arrangement able to spatially modulate the distribution of the charge carriers or electric field in said intermediate layer when an electric current is injected into the p-n junction or the latter is reverse biased, so as to then create in the structure a diffraction grating, whose pitch spacing is equal to the period of the arrangement, and in that the periodic arrangement is in one of the first and second semiconductor layers and consists of a sequence of first semiconductor zones having a doping below $10^{19}$ cm$^{-3}$ and of type opposite to that of the semiconductor layer in which is located the periodic arrangement, alternating with second semiconductor zones having the same doping type as that of the semiconductor layer in which the periodic arrangement is located.

Said first zones may not be intentionally doped and then their doping is well below $10^{17}$ cm$^{-3}$.

The period of the arrangement is chosen as a function of the value of the wavelength relative to the e.g. electromagnetic waves with which the structure is to be used. The arrangement is given a period of the order of magnitude of said wavelength (i.e. approximately 1 to 10 times said wavelength).

Preferably, to facilitate the production of the structure according to the invention, the thickness of said first zones is below or approximately equal to the period of the periodic arrangement.

Admittedly document (12) discloses a semiconductor structure incorporating a periodic arrangement, where the regularly spaced zones have a doping type opposite to that of the semiconductor layer in which said zones are located. However, the doping of said zones is high ($10^{19}$ cm$^{-3}$). This leads to high optical losses in said known structure.

The present invention obviates this disadvantage through the use of said first zones, whose doping is lower (below $10^{19}$ cm$^{-3}$).

Moreover, document (12) states that the thickness of said zones must sufficiently exceed the diffusion length of the minority carriers in these zones (condition I). The use of a high doping of the latter induces a limited diffusion length, which permits the production of structures of the type described in (12).

However, it has been seen that a high doping leads to high optical losses. By reducing this doping, the diffusion length increases and the teaching of document (12) then leads to very thick periodic zones, which it is difficult to produce as a result of the very limited spacing between said zones (said spacing being approximately the same as the wavelength of the waves interacting with the structure). Even if it was possible to produce these zones, the following stage of the epitaxial growth of the semiconductor material for surrounding the said zones would be extremely difficult to put into effect (said material being virtually unable to penetrate between said zones).

In the present invention the aforementioned condition I is not imposed. Through failing to respect this condition the structure is not prevented from functioning, because the semiconductor junction existing between said zones and their environment is not polarized or biased.

It should be noted that the present invention can be performed e.g. with materials of the InP group and with dopings of approximately $10^{17}$ cm$^{-3}$ to $10^{18}$ cm$^{-3}$, which leads to diffusion lengths up to 100 times higher than those obtained by following the teaching of document (12). With such diffusion lengths, the structures described in (12) would virtually be impossible to produce and it would in fact require etchings of a semiconductor material with a depth of 0.5 $\mu$m or more and e.g. with a periodicity of 0.2 $\mu$m.

Document (13) also discloses a semiconductor structure having a periodic arrangement of regularly reciprocally spaced, semiinsulating zones. However, such a structure has optical losses due to the semiinsulating material. Moreover, the semiinsulating zones cannot be produced on the p side of the structure (the semiinsulating zones would then be in a p-type semiconductor) because, in this case, they lose their semiinsulating character due to interdiffusion phenomena between the dopants (e.g. Be, Cd, Zn) of type p and the dopants (typically iron) leading to a semiinsulating material. In this connection reference should be made to document (14). The present invention does not suffer from these disadvantages.

According to a first embodiment, the structure according to the invention also has means for injecting an electric current into the p-n junction, the periodic arrangement being able to spatially modulate the inflow of current into the intermediate layer.

According to a second embodiment, said structure also incorporates reverse bias means of the p-n junction, the periodic arrangement being able to spatially modulate the electric field in said p-n junction.

According to a preferred embodiment of the structure according to the invention, the periodic arrangement is formed on the side of the second semiconductor layer.

The diffraction grating which the structure according to the invention makes it possible to create, can be used for diffracting an unguided electromagnetic wave in the structure and dropping on the latter or, conversely, an electromagnetic wave which is guided in the structure.

For a particular use of the invention, corresponding to the latter case, the intermediate semiconductor layer is a light guiding layer and the first and second semiconductor layers are confinement layers able to confine light in the intermediate layer, so as to form a distributed feedback optoelectronic device.

The light guidance layer can be an active layer forming the light amplifying medium, the periodic arrangement thus permitting the spatial modulation of the gain of the structure.

Conversely, the light guidance layer can be a passive layer, which does not amplify the light which it guides, the periodic arrangement thus permitting the formation of an index grating in the structure.

In the invention, the zones which alternate with one another can have different optical indexes so as to form an index grating.

BRIEF DESCRIPTION OF THE SEVERAL VIEWS OF THE DRAWING

The invention is described in greater detail hereinafter relative to non-limitative embodiments and with reference to the attached drawings, wherein show.

DESCRIPTION OF THE INVENTION

Figure 1:
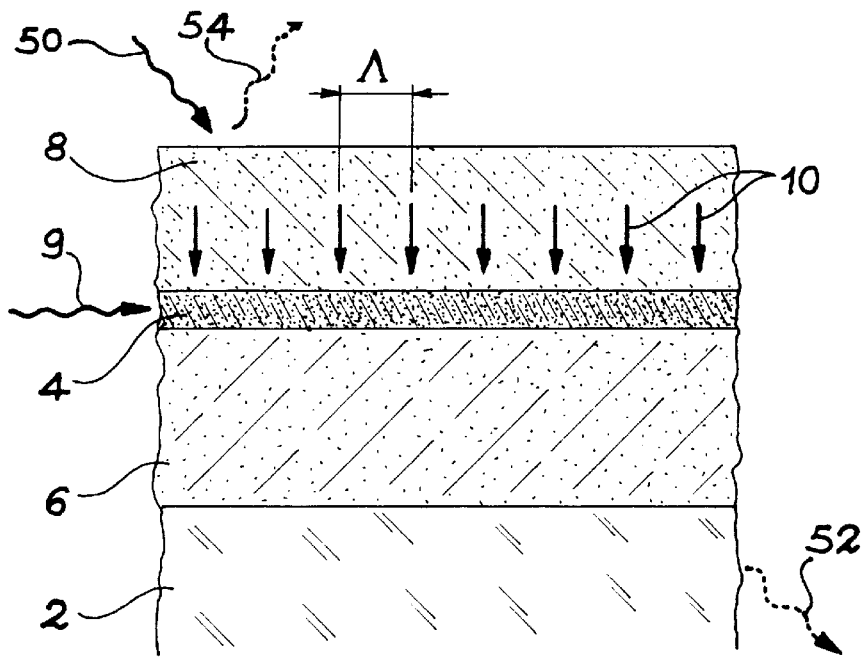
FIG. 1 diagrammatically the principle of a structure according to the invention.

The principle of a structure according to the invention is diagrammatically illustrated by FIG. 1 on which it is possible to see a semiconductor substrate 2 on which rests a stack of semiconductor layers comprising a light guiding semiconductor layer 4 between two semiconductor layers 6 and 8, whose dopings are opposite and which thus form a p-n junction, said layers 6 and 8 having forbidden band widths greater than that of the layer 4 and being able to confine light in said layer 4.

The layer 4, between the e.g. n-type, lower confinement layer 6 and the e.g. p-type, upper confinement layer 8 can be passive (light guidance only) or active (then constituting a light amplifying medium).

According to the invention, the stack is provided with a periodic arrangement formed in the layer 8 and able to spatially modulate an electric current injected into the p-n junction, the period $\Lambda$ of said arrangement being of the same order of magnitude as the wave guide 9 to be guided by the layer 4. The arrows 10 symbolize this spatial modulation.

The thus modulated current leads to concentration variations of the charge carriers in the layer 4 and in turn said carriers produce a spatial modulation of the gain when the guidance layer 4 is an active medium or a spatial guidance of the optical index in the layer 4 when the latter is a passive layer (the device then being intended to e.g. constitute an optical guide or an optical filter).

This gives a pure gain grating or an index grating, whose pitch spacing is equal to the period $\Lambda$ of the periodic arrangement with which the structure is provided.

Figure 2:
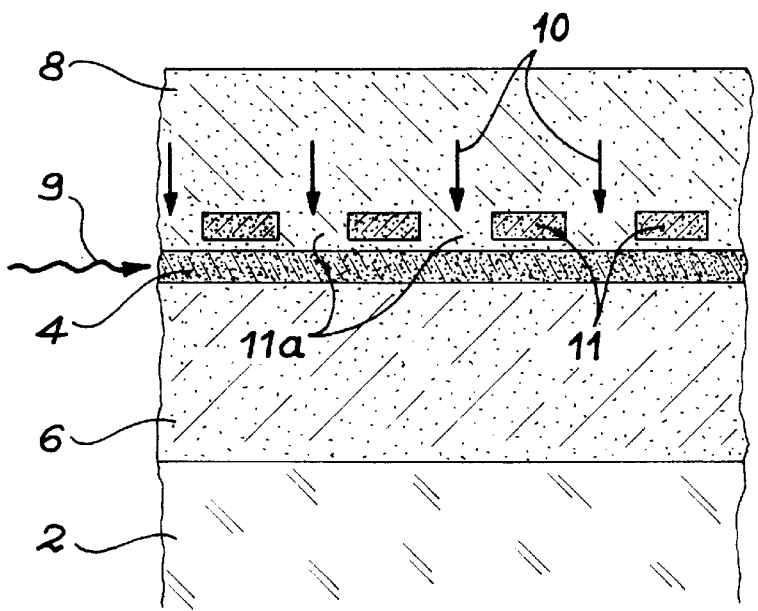
FIG. 2 diagrammatically the possibility with the present invention of obtaining complex coupling gratings where the gain part and the index part can be adjusted independently of one another.

FIG. 2 diagrammatically and partially illustrates the combination of an optical index grating with the structure of FIG. 1, in which the guidance layer 4 is assumed to be active (light amplifying medium).

This optical index grating has a pitch spacing equal to the period $\Lambda$ of the arrangement able to modulate the electric current and has, in the layer 8, zones 11, whose optical index is different from that of said layer 8 and which alternate with zones 11a of said layer 8.

This leads to a complex coupling, where the part of the gain and the part of the optical index can be adjusted independently of one another, because they are based on different principles. It is even possible to phase shift the gain grating with respect to the index grating by modifying the respective positions of the gain maxima and the index maxima.

In the embodiment shown in FIG. 2, if the optical index of the zones 11 exceeds that of the zones 11a, the gratings are in phase opposition and, in the opposite case, the gratings are in phase.

The spatial modulation of the current can be brought about in different ways in structures according to the invention having a p-n junction and a light guidance layer, by periodically blocking the entry of current up to the light guidance layer.

A number of examples are diagrammatically and partially illustrated by FIGS. 3A to 4B.

In FIG. 3A it is again possible to see the light guidance layer 4 (of intrinsic semiconductor material) between the lower confinement layer 6 made from a n-type semiconductor material and the upper confinement layer 8, made from a p-type semiconductor material, on the n-type semiconductor substrate 2.

Figure 3A:
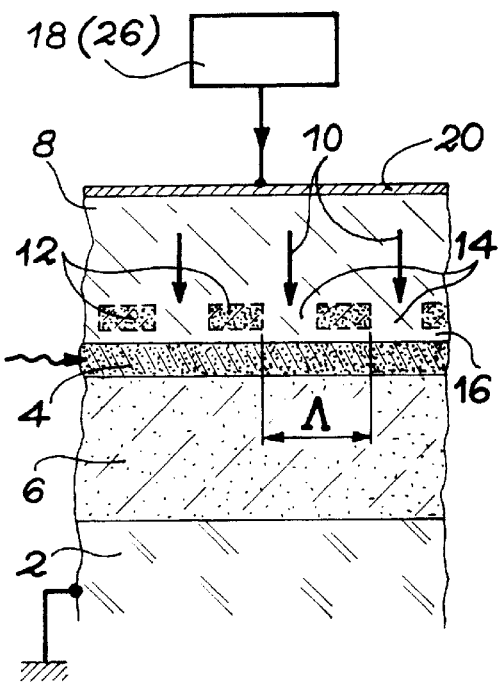
FIGS. 3A and 3B diagrammatic, partial views of structures according to the invention, which use a periodic arrangement with n-type semiconductor zones alternating with p-type semiconductor zones.

In the case of FIG. 3A, the periodic arrangement of period $\Lambda$ has zones 12 made from a n-type, optical confinement semiconductor material and located in the layer 8 and which can be in the vicinity of the layer 4 (case of FIG. 3A) or in contact therewith, said zones 12 alternating with zones 14 made from the constituent material of the layer 8 (p-type semiconductor).

The thickness of the p-type semiconductor layer 6 which can exist between the periodic arrangement and the layer 4 is very small, e.g. less than 50 nm.

The structure shown in FIG. 3A also has means 18 for injecting a current into the layer 8, via an electrode 20 provided in said layer 8 and in order to forward bias the p-n junction formed by the layers 6 and 8. The semiconductor zones 12 block, with the period Λ, the entry of current into the layer 4.

Thus, at the said zones 12, there are p-n-i-n-type blocking junctions, whereas at the zones 14 there are conductive junctions of the p-i-n type.

Figure 3B:
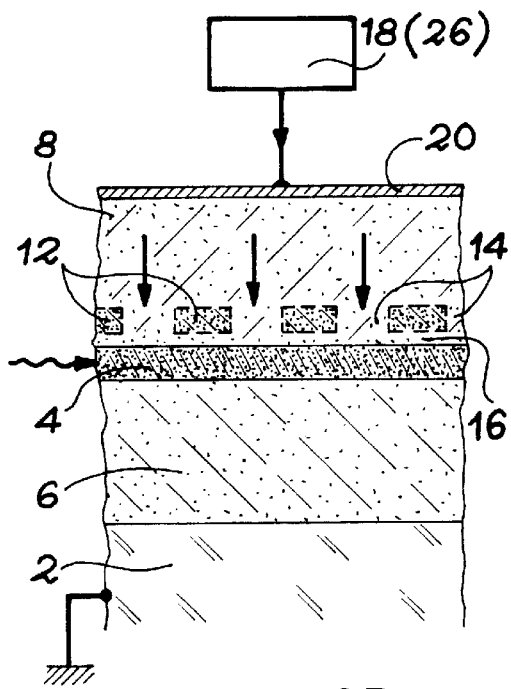

A constructional variant is diagrammatically and partially illustrated by FIG. 3B, where the substrate 2 and the lower confinement layer 6 are of the p-type and where the upper confinement layer 8 are of the n-type. The zones 12 are here of the p-type and alternate with the n-type zones 14 of the layer 8.

It is optionally possible to provide a semiconductor 16 of very limited thickness (and of n-type in the case of FIG. 3B) between the layer 4 and the periodic arrangement, where the p-type zones 12 alternate with the n-type zones 14.

In the case of FIG. 3B, the means 18 are also provided for injecting a current into the layer 8 and for the forward biasing of the p-n junction. The functioning of said structure is similar to that of the structure shown in FIG. 3A.

It is pointed out that the doping of the zones 12 is below $10^{19}$ cm$^{-3}$. The doping of the layer 8 and consequently zones 14 is typically between $5 \times 10^{17}$ cm and $2 \times 10^{18}$ cm$^{-3}$.

Figure 4A:
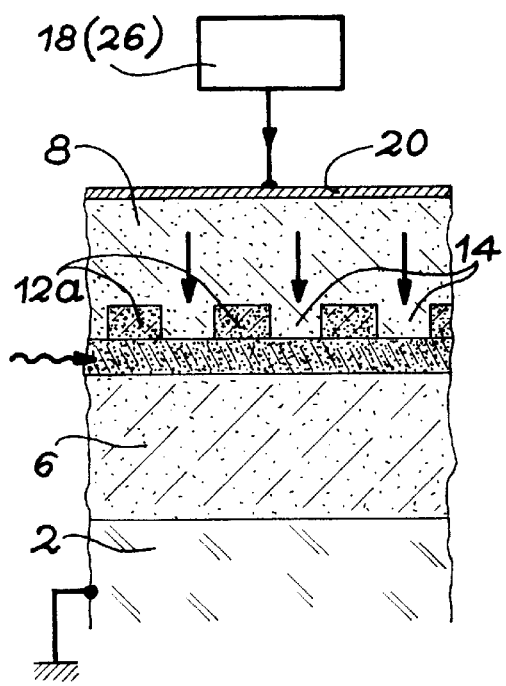
FIGS. 4A and 4B diagrammatic, partial views of other structures according to the invention using a periodic arrangement in which the semiinsulating zones or undoped semiconductor zones alternate with doped semiconductor zones.

In another constructional variant diagrammatically and partly illustrated by FIG. 4A, the structure is in accordance with that of FIG. 3A except that there is no layer 16 and the zones 12 are replaced by zones 12a made from a not intentionally doped semiconductor material, the zones 14, which form part of the layer 8, being of the p-type. In this case, blocking junctions are obtained at the zones 12a.

Figure 4B:
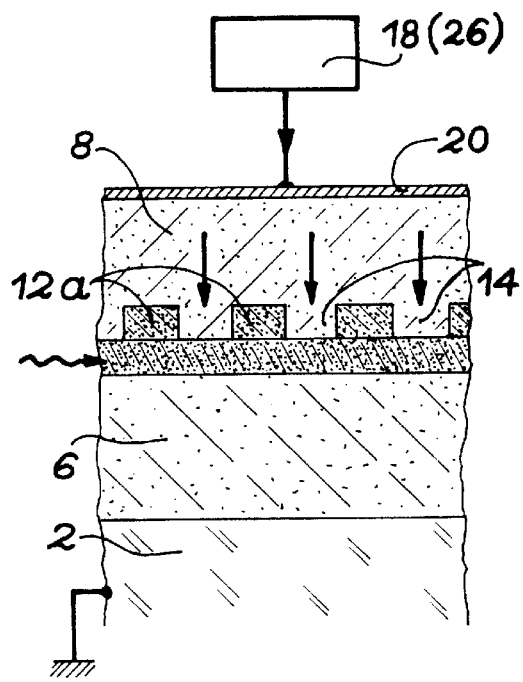

Another constructional variant is diagrammatically and partially illustrated by FIG. 4B, where the structure is identical to that of FIG. 3B except that there is no longer a layer 16 and the zones 12 are replaced by zones 12a made from a not intentionally doped semiconductor material. In this case, once again blocking junctions are obtained at the zones 12a.

It is pointed out that the thickness of the zones 12 and 12a is equal to or below the period of the arrangement of which they form part.

Figure 5:
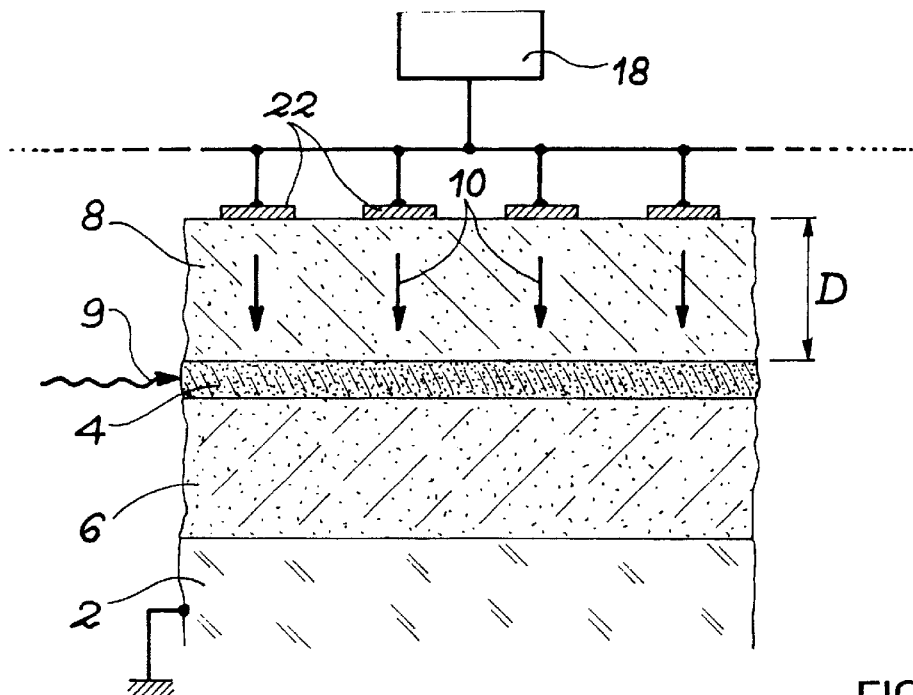
FIG. 5 a diagrammatic, partial view of a semiconductor structure using a periodic arrangement formed from regularly spaced, elementary electrodes.

Another semiconductor structure is diagrammatically and partly shown in FIG. 5. This structure is identical to that of FIG. 3A, except that the zones 12 are eliminated and the continuous electrode 20 is replaced by a periodic sequence of elementary electrodes 22 formed on the layer 8 and of period Λ of the same order of magnitude as the wavelength of the light 9 to be guided by the structure. The means 18 once again make it possible to inject a current into each of the elementary electrodes 22 and to forward bias the p-n junction.

It is pointed out that in the case of the structure of FIG. 5, it is appropriate for the distance D between the elementary electrodes 22 and the guidance layer 4 to be of the same order of magnitude as the diffusion length of the carriers in the upper confinement layer 8 or less than said length, so that the structure operates in an appropriate manner.

In a not shown variant of the structure of FIG. 5, the substrate and the lower confinement layer are of p-type and the upper confinement layer is of n-type.

In the case where the guidance layer 4 is active, the structures according to FIGS. 3A to 5 make it possible to obtain a pure gain grating and in the case where the layer 4 is passive to obtain index gratings.

In order to obtain a complex coupling in the case where said layer 4 is active (amplifier medium), it is merely necessary for the structures of FIGS. 3A to 4B for the optical index of the zones 12 to differ from the optical index of the zones 14.

The material forming the zones 14 and the material forming the zones 12 is appropriately chosen so as to obtain predetermined optical indexes and in this way it is possible to control the amplitude of the index grating.

A gain grating in phase with the index grating is obtained if the highest of the optical indexes of the zones 12 and 14 corresponds to the conductive junctions, where the gain is at a maximum, and a gain grating in phase opposition with the index grating is obtained if the highest optical index corresponds to the blocking junctions.

Figure 6:
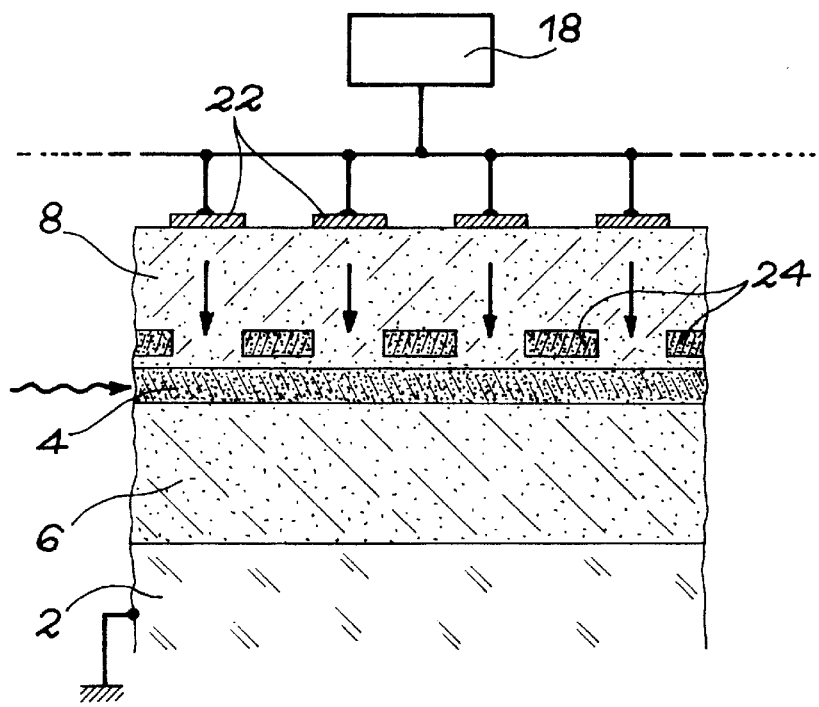
FIG. 6 a diagrammatic, partial view of a semiconductor structure having, in addition to that of FIG. 5, a diffraction grating.

With regards to the structure of FIG. 5, in order to obtain a complex coupling, it is necessary to add to said structure (whose layer 4 is then active) an index grating, as is diagrammatically and partially shown in FIG. 6. This index grating consists of a sequence of zones 24 located in the upper confinement layer 8 and therefore on the side of the elementary electrodes 22.

These zones 24 are located in the vicinity of the layer 4, have the same period as the elementary electrodes 22 and are made from a semiconductor material having the same doping type as that of the layer 8, but which has an optical index different from that of the layer 8, said zones 24 being positioned facing gaps separating the elementary electrodes 22.

The periodic arrangements or layouts used in the structures of FIGS. 3A, 3B, 4A and 4B could be produced in the lower confinement layer 6, but are preferably formed in the upper confinement layer 8 in the manner illustrated in the said drawings, which makes it possible to obtain a given complex coupling (by appropriately choosing the material from which zones 12 and zones 14 are made) without it being necessary to etch the active layer.

Other structures according to the invention can be produced by replacing, in the structures of FIGS. 3A, 3B, 4A, 4B (which constitute distributed feedback optoelectronic devices), the means 18 by means 26, which reverse bias the p-n junction. In this case, the guidance layer 4 is assumed to be passive (light guidance only). In this way an index grating is formed.

It is the spatial modulation of the electric field in the junction and therefore in the guidance layer, which creates this grating due to electrooptical effects.

A description is given hereinafter of a process making it possible to obtain a structure according to the invention and which is diagrammatically and partly shown in FIG. 7 and which constitutes a distributed feedback optoelectronic device.

Figure 7:
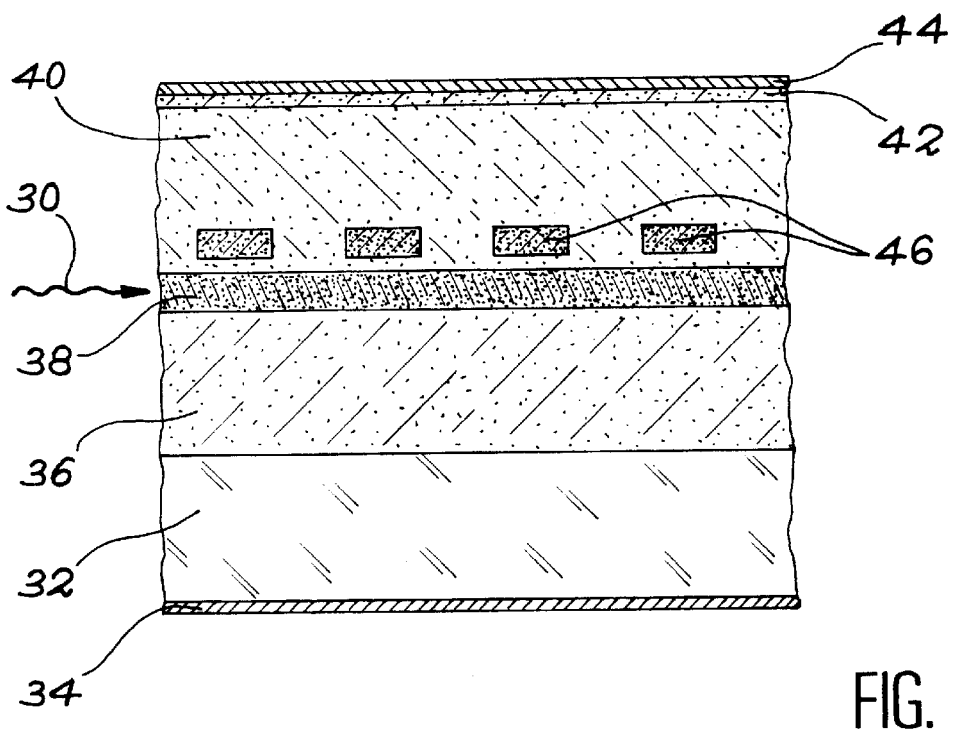
FIG. 7 a diagrammatic, partial view of an embodiment of the structure according to the invention.

The device of FIG. 7 is a GaInAsP/InP laser having coupling by pure gain, which emits light with a wavelength of e.g. 1.5 or 1.3 μm and which is produced on a n-type semiconductor substrate.

Coupling by pure gain is obtained as a result of a grating of n-type zones and p-type zones, which alternate with one another and which are made from an optical confinement material (InP in the present embodiment).

The difference between the optical index of the n-type material and the optical index of the p-type material (materials having the same forbidden band width) is very small and can be completely cancelled out by the choice of the doping level.

In the given embodiment, use is widely made of the InP semiconductor material, but it is obvious that it would be possible to use other materials such as e.g. GaAs and more generally materials of type III-V, as well as materials of type II-VI.

The laser of FIG. 7 is shown in longitudinal section along a plane parallel to the light propagation direction 30.

This laser consists of a stack of layers encountered in known laser structures and which forms a double heterostructure optical guide, namely:

a n-type InP substrate 32 having on its lower face a TiAu alloy electrode and on its upper face a n-doped InP buffer layer 36 forming a lower light confinement layer, on said buffer layer 36, an active layer 38 of thickness 90 nm made from solid GaInAsP or formed from a stack of alternating GaInAs/GaInAsP layers forming an active structure with quantum wells having a GaInAsP optical guide with a constant or gradual composition, but different from the composition of the material of the quantum wells, the active structure corresponding to a laser emission of adjusted wavelength in the 1.5 or 1.3 μm range, on the active layer 38, a p-type InP layer 40, which constitutes an upper light confinement layer, on said layer 40, a 0.2 μm thick, p$^+$-type GaInAs contact layer 42, on which is formed an alloy TiPt electrode 44 (on the upper side of the active stripe of the laser).

According to the invention, the device of FIG. 7 also has on the side of the upper optical confinement layer 40, a n-doped InP layer 46, whose thickness is e.g. 50 nm and which is periodically etched and covered by p-doped InP material of the upper optical confinement layer 40, thus forming a grating constituted by n-doped InP zones separated by p-doped InP zones.

A very small p-doped InP thickness can separate said grating from the active layer 38, as can be seen in FIG. 7.

Figure 8:
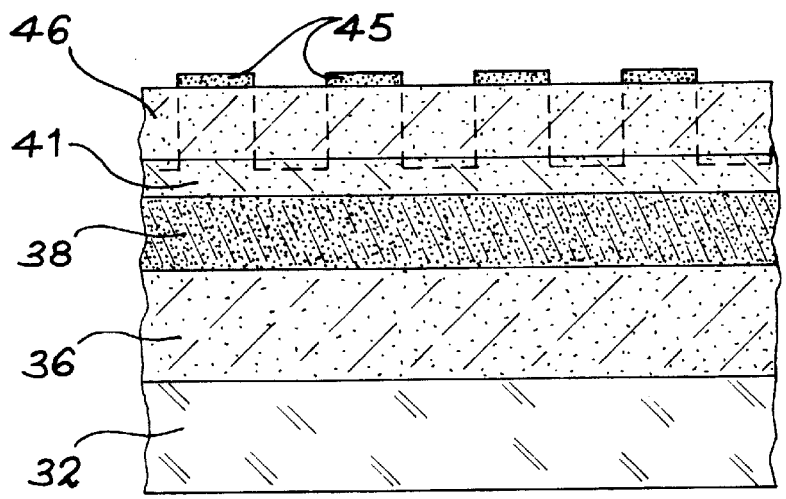
FIGS. 8 to 10 diagrammatically the stages of a production process for the structure of FIG. 7.
Figure 9:
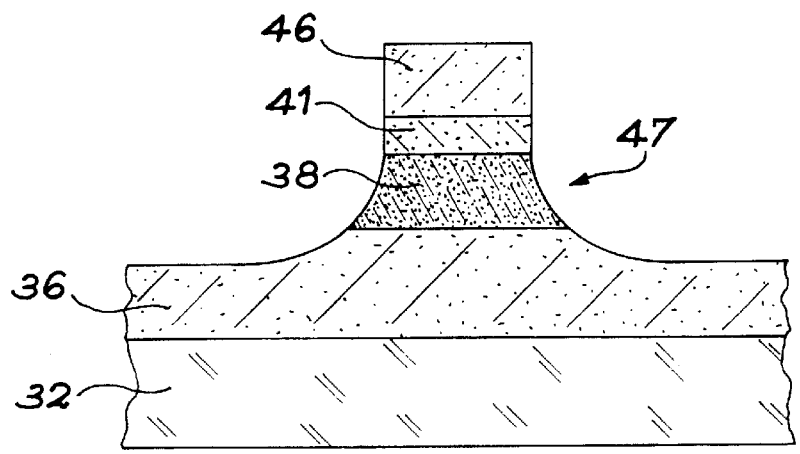
Figure 10:
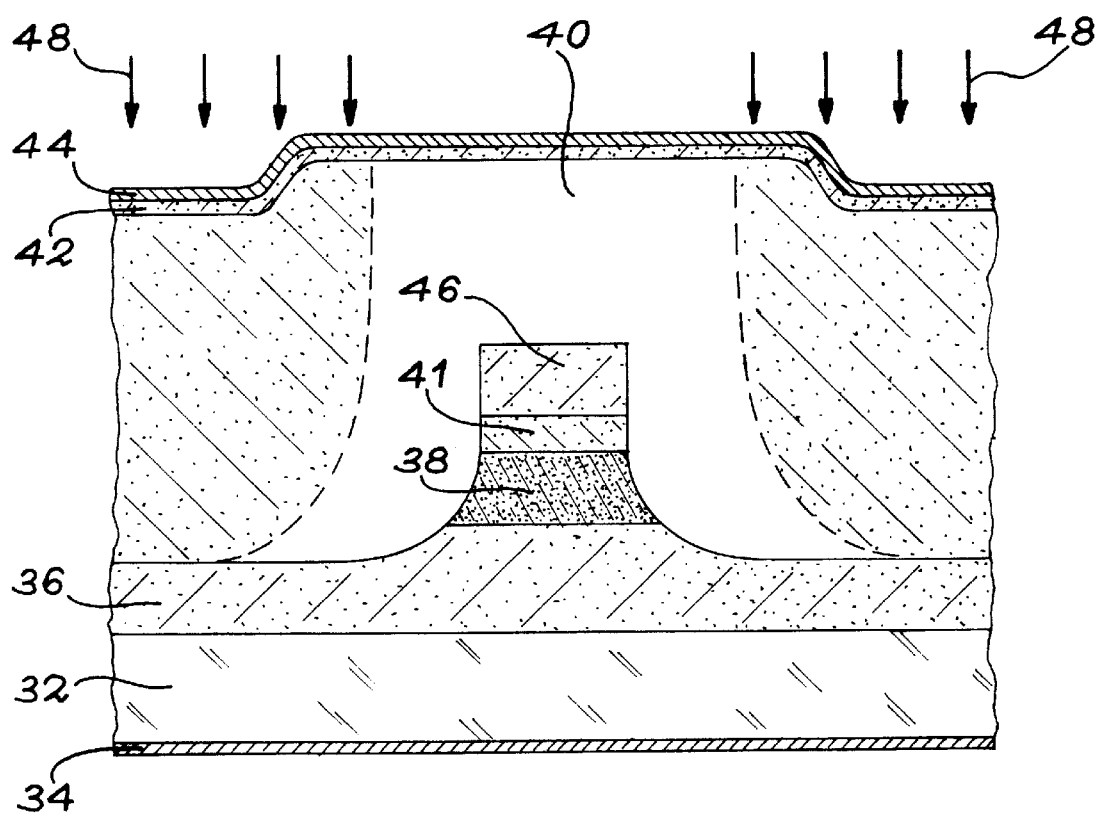

In a purely indicative and non-limitative manner, a description will be given hereinafter of a process for the production of the device of FIG. 7 taking as the example a BRS structure (cf. document (11)). FIGS. 8 to 10 diagrammatically and partially illustrate the important stages of this process.

On a n-type InP substrate 32 are successively deposited in a first metalorganic vapour phase epitaxy cycle or MOVPE:

a n-type InP layer 36 doped between $5\times10^{17}$ and $3\times10^{18}$ cm$^{-3}$, a GaInAsP active layer 38 of composition corresponding to a light emission in the range centered on 1.3 or 1.5 μm, as a function of what is required, a p-type InP protection layer 41, whose doping is between $5\times10^{16}$ and $5\times10^{18}$ cm$^{-3}$ and the thickness is below 50 nm and is e.g. 20 nm, a n-type InP layer 46 intended for the formation of the grating of FIG. 7 and whose doping is between $5\times10^{17}$ and $5\times10^{18}$ cm$^{-3}$, the thickness of said layer 46 being between 1 and 1000 nm and being e.g. 50 nm.

This gives a stack shown in longitudinal section in FIG. 8.

This is followed by the etching of the layer 46 through a mask 45 obtained by an electronic masking means or by holographic exposure, in order to obtain a periodic grating with a spatial period close to that of the wavelength of the light to be guided in the active layer.

The following stage consists of etching the laser stripe 47 in crystalographic direction <110> or <1$\bar{1}$0>, but perpendicular to the lines of the grating. This stage is diagrammatically illustrated in FIG. 9, which is a cross-sectional view of the laser during production.

In the described embodiment, etching takes place chemically, but it is also possible to use dry etching, e.g. ionic etching and/or plasma etching or ion beam etching.

This is followed by a second MOVPE epitaxy cycle in order to successively grow (FIG. 10):

the InP layer 40 p$^+$-doped between $1\times10^{17}$ cm$^{-3}$ and $1\times10^{19}$ cm$^{-3}$ (e.g. $2\times10^{18}$ cm$^{-3}$), the GaInAs layer 42 p$^+$-doped between $1\times10^{18}$ cm$^{-3}$ and $2\times10^{19}$ cm$^{-3}$ (e.g. $1\times10^{19}$ cm$^{-3}$).

This is followed by the formation of the upper electrode 44 of the laser diode on the layer 42 performing a deposition of alloy TiPt, which is recharged with Au. This is followed by the deposition on the lower face of the substrate 32 of the lower electrode 34 of the diode laser, which is of alloy TiAu.

In order to bring about an electrical insulation of the remainder of the surface, an ion proton implantation takes place (symbolized by the arrows 48) of the two sides of the laser stripe, which makes the p-type InP layer 40 semiinsulating.

This gives a monofrequency, DFB-type laser with an excellent SMSR exceeding 50 dB.

Most of the resulting lasers remain in monofrequency form up to the maximum current which can be withstood by the structure, i.e. 300 to 600 mA CW.

In this way it is possible to obtain very good monofrequency optical power levels, particularly 40 to 70 mW and up to 110 mW in pulsating form, the limit being due to the thermal resistance of the arrangement.

The proof of the existence of the coupling by the gain is supplied by the spectral behaviour of the lasers treated on the two faces by antireflection coatings.

Even below the threshold there is a monofrequency operation, which is maintained in a wide current range, unlike in the case of lasers coupled by the index and which, with the two faces treated, would have a very definite bimode behaviour.

The invention is not restricted to such DFB lasers. It also applies in exemplified manner to the obtaining of light guides (with a passive guidance layer) provided with a Bragg grating, which are e.g. used for producing DBR lasers.

In addition, the present invention is not restricted to structures which guide light and is also directed at semiconductor structures which do not guide light. This is explained by referring once again to FIG. 1.

In the case of a non-guiding structure, layer 4 does not guide light and therefore can have a thickness well above that which it would have for guiding light.

In the case of the non-guiding structure, the light (here designated 50) is supplied to the structure, in the direction of its upper face, the arrangement then having a period Λ roughly of the order of magnitude of the wavelength of the light 50.

In this case, the electrodes such as 20 (FIG. 3A) used for biasing and controlling the structure, can be transparent to said light 50 or can have a grid structure so as to permit the passage of most of said light.

In the absence of current injection or reverse biasing, there is no diffraction grating and the light 50 traverses the structure, whose constituent materials are chosen so as to be transparent to the light in the case considered here, which leads to an output beam 52.

With current injection or reverse biasing, the diffraction grating is formed and the light 50 interacts therewith in order to give a diffracted beam 54.

In a not shown variant of the invention, layer 8 (FIGS. 3A to 4B) surrounding the zones 12 or 12a has an optical index different from that of said zones 12 or 12a and said layer 8 can be surmounted by a supplementary confinement layer having an optical index different from that of the layer 8.

Thus, the present invention not only leads to a complex coupling grating (gain/index), but also an index grating with variable coupling, i.e. a real index grating to which is added a virtual index grating (which can be made to appear and vary as required).

The following documents are cited in the present description:

(1) A. Takemoto, Y. Ohkura, H. Watanabe, Y. Nakajima, Y. Sakakibara, S. Kakimoto, H. Namizaki, "Dependence of characteristics of buried grating type DFB laser diodes on the coupling constant", Technical Digest, 12 IEEE International Semiconductor Laser Conference, September 92, Davos, Switzerland, paper E-3.

(2) W. Streifer, R. D. Burnham, D. R. Scifres. "Effect of External reflectors on longitudinal modes of distributed feedback lasers", IEEE J. Quantum Electron., QE-11 (1975), p.154.

(3) K. Utaka, S. Akiba, K. Sakai, Y. Matsushima, "Analysis of quarter wave shifted DGB lasers", Electron., Lett., 20 (1984), p.326.

(4) H. Kogelaik, C. V. Shank, "Coupled wave theory of distributed feedback lasers", J. Appl. Phys. 43 (1972), p.2327.

(5) Y. Nakano, Y. Luo, K. Tada, Appl. Phys. Lett., 55(1989), p.1606; same authors: Extended Anstracts, 1988 International Conference on Solid State Devices and Materials, Tokyo, 1988, paper D-4-4.

(6) B. Borchert, K. David, B. Stegmueller, R. Gessner, M. Beschorner, D. Sacher, G. Franz, IEEE Photon. Technol. Lett., 3(1991), p.955.

(7) W. T. Tsang, F. S. Choa, M. C. Wu, Y. K. Chen, R. A. Logan, A. M. Sergent, C. A. Burrus, IEEE Photon. Technol. Lett., 4(1992), p.212.

(8) K. Tada, "Gain coupled DFB lasers", Technical Digest, OFC/IOOC'93, San Diego, paper ThB1 (invited).

(9) K. Kudo, J. I. Shim, K. Komori, S. Arai, "Reduction of effective linewidth enhancement factor of DFB laser with complex coupling coefficients", IEEE Photon. Technol. Lett., 4(1992), p.531.

(10) Y. Luo, Y. Nakano, K. Tada, T. Inoue, H. Hosomatsu, H. Iwaoka, "Fabrication and characteristics of gain coupled DFB semiconductor lasers with a corrugated active layer", IEEE J. Quantum Electron., 7(1991), p.1724.

(11) J. Charil, S. Slempkes, D. Robein, C. Kazmierski, J. C. Bouley, "Extremely low threshold operation of 1.5μ GaInAsp/In Buried Ridge Stripe Losers", Electron. Lett. 25(1989), p.1477.

(12) FR-A-2684498 (MITSUBISHI DENKI K.K.)

(13) JP-A-01124279 (MATSUSHITA ELECTRIC)

(14) C. Kazmierski, D. Robein and Y. Gao, "Universal iron behaviour in Zn-, Cd- and Be- doped p-type InP" J. of crystal growth 116 (1992), p.75.

What is claimed is:

1. Semiconductor structure comprising:

a first semiconductor layer (6) having a first doping type, an intermediate semiconductor layer (4) placed above the first semiconductor layer and a second semiconductor layer (8) having a second doping type which is the opposite to the first type, said second semiconductor layer being placed above the intermediate semiconductor layer and forming, with the first semiconductor layer, a p-n junction, the forbidden band width of the first and second semiconductor layers being greater than that of the intermediate semiconductor layer, said structure being characterized in that it also comprises on one side of the intermediate semiconductor layer (4), a periodic arrangement of regular repeating first zones having a spacing defining a period (12, 14; 12a, 14) able to spatially modulate the distribution of the charge carriers or electric field in said intermediate layer when an electric current is injected into the p-n junction or the p-n junction is reverse biased, so as to then create in the structure a diffraction grating having a regular, repeating pattern defining a pitch, whose pitch spacing is equal to the period of the arrangement, and in that the periodic arrangement is in one of the first and second semiconductor layers and consists of a sequence of the first semiconductor zones having a doping below about $10^{18}$ cm$^{-3}$ and of type opposite to that of the semiconductor layer in which is located the periodic arrangement, alternating with second semiconductor zones having the same doping type as that of the semiconductor layer in which the period arrangement is located.

2. Structure according to claim 1, characterized in that the thickness of said first zones is less or approximately equal to the period of the periodic arrangement.

3. Structure according to claim 1, characterized in that it also incorporates means (18) for injecting an electric current into the p-n junction, the periodic arrangement being able to spatially modulate the entry of current in the intermediate layer.

4. Structure according to claim 1, characterized in that it also incorporates means (26) for the reverse biasing of the p-n junction, the periodic arrangement being able to spatially modulate the electric field in said p-n junction.

5. Structure according to claim 1, characterized in that the periodic arrangement (12,14,12a,14) is formed on the side of the second semiconductor layer.

6. Semiconductor structure according to claim 1, characterized in that the intermediate semiconductor layer is a light guidance layer and in that the first and second semiconductor layers are confinement layers able to confine light in the intermediate layer, so as to form a distributed feedback optoelectronic device.

7. Structure according to claim 6, characterized in that the light guidance layer (4) is an active layer constituting a light amplifying medium, the periodic arrangement thus permitting the spatial modulation of the gain of the structure.

8. Structure according to claim 6, characterized in that the light guidance layer (4) is a passive layer, which does not amplify the light which it guides, the periodic arrangement thus permitting the formation of an index grating in the structure.

9. Structure according to claim 1, characterized in that the zones alternating with one another have optical indices which are different from each other in order to form an index grating.

* * * * *

UNITED STATES PATENT AND TRADEMARK OFFICE
CERTIFICATE OF CORRECTION

PATENT NO. : 5,821,570
DATED : October 13, 1998
INVENTOR(S) : Kazmierski et al.

It is certified that error appears in the above-identified patent and that said Letters Patent is hereby corrected as shown below:

Title page, item [56], References Cited, U.S. PATENT DOCUMENTS, 7th Reference, delete "6/1994" and insert --7/1994--.

Column 7, Line 30, delete "$5 \times 10^{17}$ cm" and insert --$5 \times 10^{17}$ cm$^{-3}$--.

Column 11, Line 29, delete "Kogelaik" and insert --Kogelnik--.

Column 11, Line 54, delete "GaInAsp/In" and insert --GaInAsp/Inp--.

Column 11, Line 54 delete "Losers" and insert --Lasers--.

Signed and Sealed this

Ninth Day of February, 1999

Attest:

Attesting Officer

*Acting Commissioner of Patents and Trademarks*